US007596035B2

(12) United States Patent
Doyle et al.

(10) Patent No.: US 7,596,035 B2
(45) Date of Patent: Sep. 29, 2009

(54) MEMORY DEVICE BIT LINE SENSING SYSTEM AND METHOD THAT COMPENSATES FOR BIT LINE RESISTANCE VARIATIONS

(75) Inventors: Daniel Doyle, Boise, ID (US); Jeffrey B. Quinn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 11/824,082

(22) Filed: Jun. 29, 2007

(65) Prior Publication Data
US 2009/0003087 A1    Jan. 1, 2009

(51) Int. Cl.
*G11C 7/10* (2006.01)
(52) U.S. Cl. .............................. 365/189.06; 365/230.03; 365/230.04; 365/230.01; 365/203
(58) Field of Classification Search ............ 365/189.06, 365/230.03, 230.04, 203
See application file for complete search history.

(56) References Cited

U.S. PATENT DOCUMENTS

| 6,031,779 | A | * | 2/2000 | Takahashi et al. ............ 365/226 |
| 2001/0035548 | A1 | * | 11/2001 | Wahlstrom .................. 257/296 |
| 2006/0227090 | A1 | * | 10/2006 | Ishii ............................ 345/98 |
| 2007/0258313 | A1 | * | 11/2007 | Yu et al. ................. 365/230.05 |

* cited by examiner

*Primary Examiner*—Thong Q Le
(74) *Attorney, Agent, or Firm*—Dorsey & Whitney LLP

(57) ABSTRACT

Systems, devices and methods are disclosed, such as a system and method of sensing the voltage on bit lines that, when respective memory cells coupled to the bit lines are being read that compensates for variations in the lengths of the bit lines between the memory cells being read and respective bit line sensing circuits. The system and method may determine the length of the bit lines between the memory cells and the sensing circuits based on a memory address, such as a block address. The system and method then uses the determined length to adjust either a precharge voltage applied to the bit lines or the duration during which the bit lines are discharged by respective memory cells before respective voltages on the bit lines are latched.

38 Claims, 7 Drawing Sheets

MEMORY DEVICE BIT LINE SENSING SYSTEM AND METHOD THAT COMPENSATES FOR BIT LINE RESISTANCE VARIATIONS

TECHNICAL FIELD

This invention relates generally to memory devices, and, more particularly, in one embodiment, to a memory device sensing circuit and method that compensates for variations in the bit line resistance as a function of variations in the length of the bit line between the sensing circuit and an active block of memory cells.

BACKGROUND OF THE INVENTION

Memory devices include an array of memory cells that are read by sensing the voltage or charge stored by the memory cells. The memory cells are typically coupled through one or more bit lines to a sensing circuit that performs the function of sensing the voltage or stored charge. For example, in a NAND flash memory array, such as a NAND flash memory array 10 shown in FIG. 1, the array 10 is comprised of a large number of flash memory cells, collectively indicated by reference numeral 14. The array of flash memory cells 14 is typically divided into a number of blocks, one of which is shown in FIG. 1. Each block includes a number of rows, which, in the example shown in FIG. 1, includes 32 rows. The cells 14 in the same row have their control gates coupled to a common word line 30, each of which receives a respective word line signal WL0-WL31.

As also shown in FIG. 1, the cells 14 in the same column have their sources and drains connected to each other in series. Thus all of the memory cells 14 in the same column of each block are typically connected in series with each other. The drain of the upper flash memory cell 14 in the block is coupled to a bit line 20 through a first select gate transistor 24. The conductive state of the transistors 24 in each block are controlled by a source gate SG(D) signal. Each of the bit lines 20 output a respective bit line signal indicative of the data bit stored in the respective column of the array 10. The source of the lower flash memory cell 14 in the block is coupled to a source line 26 through a second select gate transistor 28. The conductive state of the transistors 28 in each block are controlled by a source gate SG(S) signal. The source line 26 receives a signal SL having various magnitudes depending upon whether the memory cells 14 are being programmed, i.e., data are being written in the cells 14, read or erased.

A read operation is performed on a row-by-row basis. When a read operation is to be performed for a selected block, the source line 26 is coupled to ground, and the select gate transistors 24, 28 for that block are turned ON responsive to high SG(D) and SG(S) signals. Also, the bit line 20 for each column is precharged. The bit line 20 is precharged by applying a high PRE signal to the gates of respective NMOS transistors 40 thereby coupling a supply voltage $V_{CC}$ to a drain of respective NMOS clamp transistors 42. The gates of the transistors 42 receive a clamp voltage BLCLMP that sets the precharge voltage of the bit lines 20 to BLCLMP less the threshold voltage $V_T$ of the transistors 42. Although NMOS clamp transistors 40, 42 are used in the embodiment shown in FIG. 1, other devices, such as PMOS transistors, may alternatively be used.

After the bit lines have been precharged, a read voltage is applied to a word line 20 for the selected row, thereby applying the read voltage to the control gates of all of the flash memory cells 14 in that row. As explained above, the magnitude of the read voltage is sufficient to turn ON all flash memory cells 14 that do not have a sufficiently charged floating gate, but insufficient to turn ON all cells that have a sufficiently charged floating gate. A voltage having a higher magnitude is applied to the word lines 20 for all of the non-selected rows. This voltage is large enough to turn ON the flash memory cells 14 even if their floating gates are storing sufficient charge to be read as programmed. As a result, the bit line 20 voltage for each column will be lowered if the cell 14 in that column of the selected row is not storing enough charge to turn OFF the device at that gate bias. Otherwise the bit line 20 remains high at $V_{CC}$.

The voltage on each bit line 20 during a read operation is applied to a gate of a respective NMOS output transistor 44 through an NMOS clamp transistor 42. The drain of the output transistor 44 is biased to $V_{CC}$ or another voltage through a PMOS transistor 46 or other device. If the bit line 20 has been pulled low responsive to all of the memory cell 14 in the column being conductive, the output transistor 44 for that column will be turned OFF, thereby allowing the input to a latch 48 to be driven to $V_{CC}$ through the transistor 46. This voltage is sampled by the latch 48 responsive to a sense enable SE signal. Once the drain of the output transistor 44 is sampled responsive to the SE signal, the latch 48 will output a "1" binary value. If, on the other hand, the memory cell 14 being read remains non-conductive, the bit line 20 will remain at its precharged level. The output transistor 44 for that column will therefore be turned ON, thereby driving the input to the latch 48 low. As a result, once the drain of the output transistor 44 is sampled responsive to the SE signal, the latch 48 will output a "0" binary value.

The speed at which a memory cell 14 can be read is often of critical importance in the performance of a memory device. The time required to read a memory cell 14 is greatly affected by the rate at which change in the voltages of the bit lines 20 can be sensed by the respective output transistors 44. The bit lines 20 are essentially transmission lines that can be represented by a long series of resistors with a capacitor coupled to ground between each pair of interconnected resistors. As a result of this capacitance coupled with the often high resistance of the bit lines 20, the voltage at the gates of the output transistors 44 changes fairly gradually responsive to a column of memory cells 14 becoming conductive. With the increased size of memory arrays and smaller geometries, which result in narrower and hence higher bit line resistances and greater bit line capacitances, these delays can become even longer. Furthermore, the rate at which the voltage at a bit line falls responsive to a string of memory cells 14 becoming conductive is a function of the length of the bit line 20 between the output transistor 44 and an active block of memory cells having the conductive string of memory cells 14. As the active block of memory cells 14 becomes further from the output transistors 44, the rate at which the voltage at the gates of the output transistors 44 fall becomes more gradual. For example, with reference to FIG. 2, the PRE signal transitions high and the BLCLMP signal transitions to an initial clamp voltage blclmpi at 0.5 μs, thereby precharging the bit line 20 to a voltage that is equal to blclmpi less the threshold voltage $V_T$ of the clamp transistor 42. The BLCLMP signal transitions to zero at 6.5 μs, and a conductive string of memory cells 14 then begins discharging the bit line 20. The BLCLMP signal transitions to a final clamp voltage blclmpf at 8.5 μs, and remains there during the remainder of the reading process. FIG. 2 shows the voltage of the bit line 20 responsive to conductive memory cells strings in four different blocks of memory cells 14 at increasing distances from the output transistor 44, which results in increasing lengths of the bit line 20 connecting the active memory to the output transistor 44. The discharge of the relatively short length of the bit line 20 for the closest block is at a fairly rapid rate 50, and the discharge of the relatively long length of the bit line 20 for the farthest block is at a substantially slower rate 52. The intermediate length bit lines 20 for the intermediate blocks discharge at intermediate rates 54, 56. As a result, when the latch 48 is enabled by the SA signal starting at 13.5 μs, the bit line 20 discharged at rates 52, 56 has a voltage that is greater than the threshold voltage $V_T$ of the output transistor 44 while the bit line 20 discharged at rates 50, 54 has a voltage that is less than the threshold voltage $V_T$ of the output transistor 44. The bit line 20 discharged at rates 52, 56 is therefore incorrectly sampled as a logic "1" while the bit line 20 discharged at rates 50, 54 is correctly sampled as a logic "0."

There is therefore a need for a circuit and method for sampling the bit lines of a memory device that can, for example, compensate for the variations in the rate at which the voltages at the gates of the output transistors 44 change as a function of distance that the active block is spaced from the output transistors 44.

DETAILED DESCRIPTION

Figure 1:
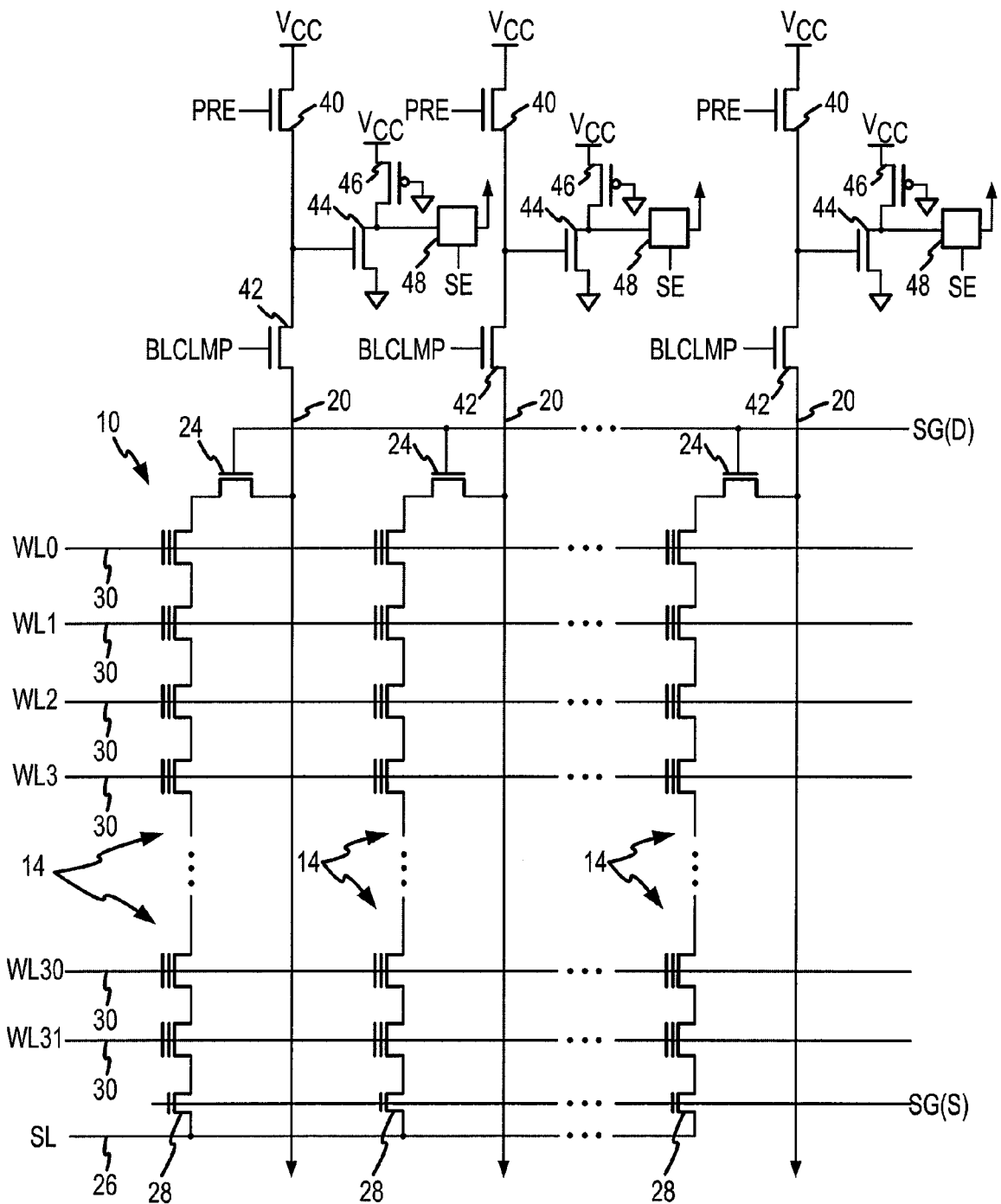
FIG. 1 is a schematic diagram of a portion of an embodiment of a prior art array of memory cells.
Figure 3:
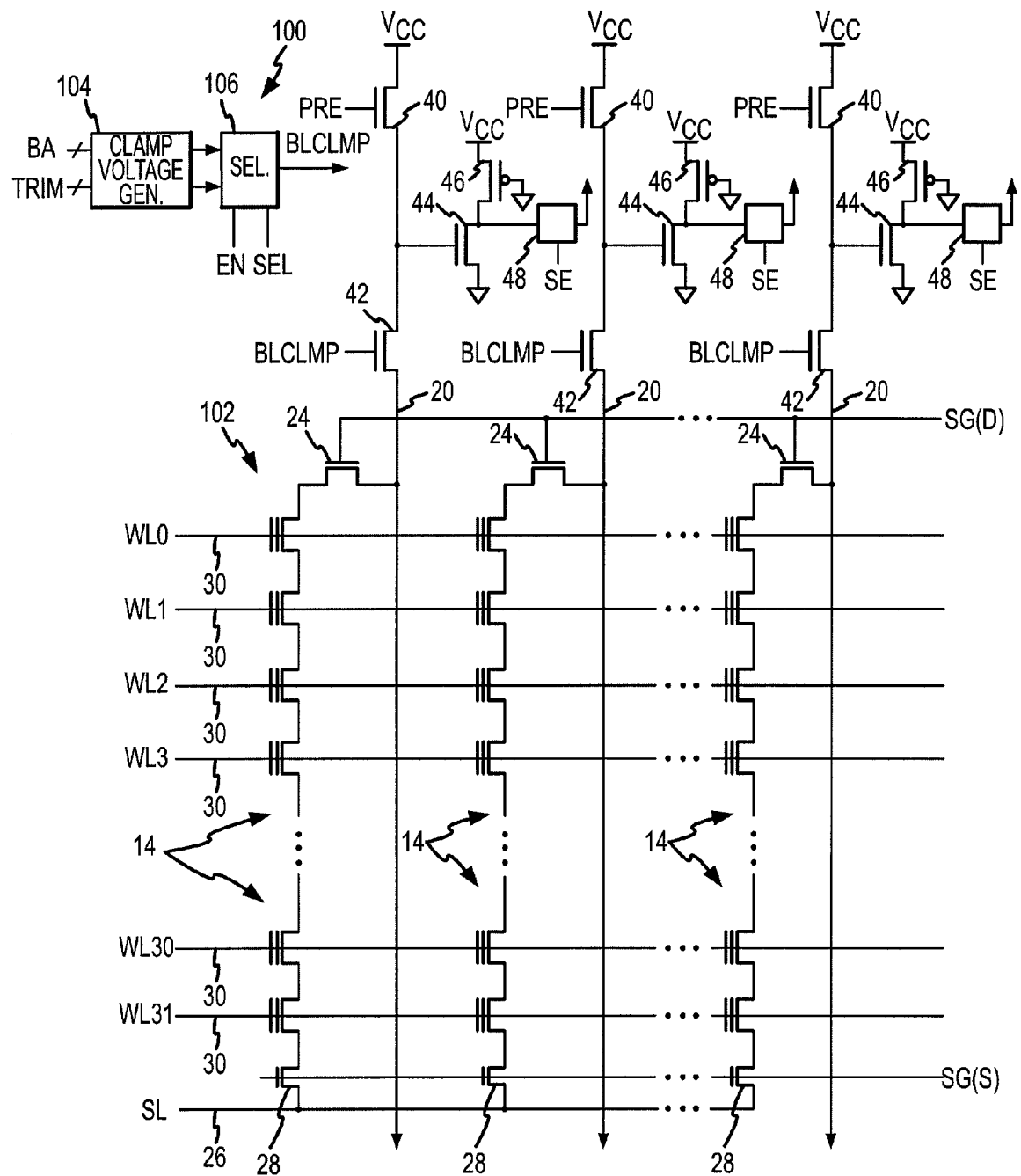
FIG. 3 is a block diagram of a bit line sensing system according to one embodiment of the invention.

An embodiment of a bit line sensing system 100 is shown in FIG. 3. The sensing system 100 is shown in the context of a NAND flash memory array 102, which is substantially identical to the NAND flash memory array 10 shown in FIG. 1. Therefore, in the interest of brevity, the components of the array 102 have been provided with the same reference numerals as the corresponding components of the array 10 shown in FIG. 1, and an explanation of their function and operation will not be repeated.

The bit line sensing system 100 varies the magnitude of the bit line clamp voltage BLCLMP as a function of the length of the bit line between the active block of memory cells and the output transistor, which is assumed to be commensurate with the distance between the output transistor and the active block of memory cells so that the time for the output transistor to sense a discharge of the respective bit line is substantially insensitive to the location of the active memory cell block. As used herein, the term "block" refers to any group of memory cells that are grouped together in a logical or functional manner, and includes, without limitation, groups of memory cells that are commonly referred to as "blocks" in, for example, flash memory devices. In the embodiment of the bit line sensing system 100 shown in FIG. 3, the location of the active memory cell block is determined by the address in a memory read request. Bits of the block address ("BA") are applied to a Clamp Voltage Generator 104, which generates the initial bit line clamp voltage blclmpi and the final bit line clamp voltage blclmpf. The magnitudes of blclmpi and blclmpf are determined at least in part by the block address bits. In one embodiment, the Clamp Voltage Generator 104 can be implemented using conventional digital-to-analog converters that convert a digital block address value into a corresponding analog voltage. The Clamp Voltage Generator 104 also receives trim bits ("Trim"), which allow the magnitudes of blclmpi and blclmpf to be adjusted as a function of process and possibly other variations. The trim bits may be controlled by conventional means, such as by programming respective fuses or anti-fuses (not shown).

The Clamp voltages blclmpi and blclmpf are applied to a Selector 106, which selects and outputs either the initial bit line clamp voltage blclmpi or the final bit line clamp voltage blclmpf. The voltage at the output of the Selector 106 is applied to the gates of the clamp transistors 42. The Selector 106 is controlled by a selection signal ("SEL") and an enable signal ("EN"). The signal SEL changes between two logic levels before and during a read operation to first apply blclmpi to the gates of the clamp transistors 42 during precharge and to subsequently apply blclmpf as a bias voltage to the gates of the clamp transistors 42 as the voltage or charged stored by a memory cell is being sensed. The enable signal is active high during most of a read operation except during a short period between which the bit lines 20 are precharged using the clamp voltage blclmpi and when the bit lines 20 are sensed the bit lines 20 are biased by the clamp voltage blclmpf being applied to the bit lines 20. The EN and SEL signals may be generated by appropriate control circuitry in a memory device using the bit line sensing system 100, which is normally used to generate control signals for controlling the operation of the memory device. Although the EN and SEL may be signals that are active high, in some embodiments they may be active low.

Although the bit line sensing system 100 shown in FIG. 3 uses the address in a memory read request to determine the location of an active memory cell block, other means may be used to determine the either the distance between the output transistors 44 and the active block or the length of the bit line between the output transistors 44 and the active block. Also, although the bit lines 20 are shown as being connected directly to the output transistors 44, it will be understood that they may be coupled to the output transistors 44 by multiplexers (not shown) other devices. The bit line sensing system 100 can still be used to compensate for variations in the lengths of the bit lines between an active memory cell 14 and the output transistors 44.

Figure 2:
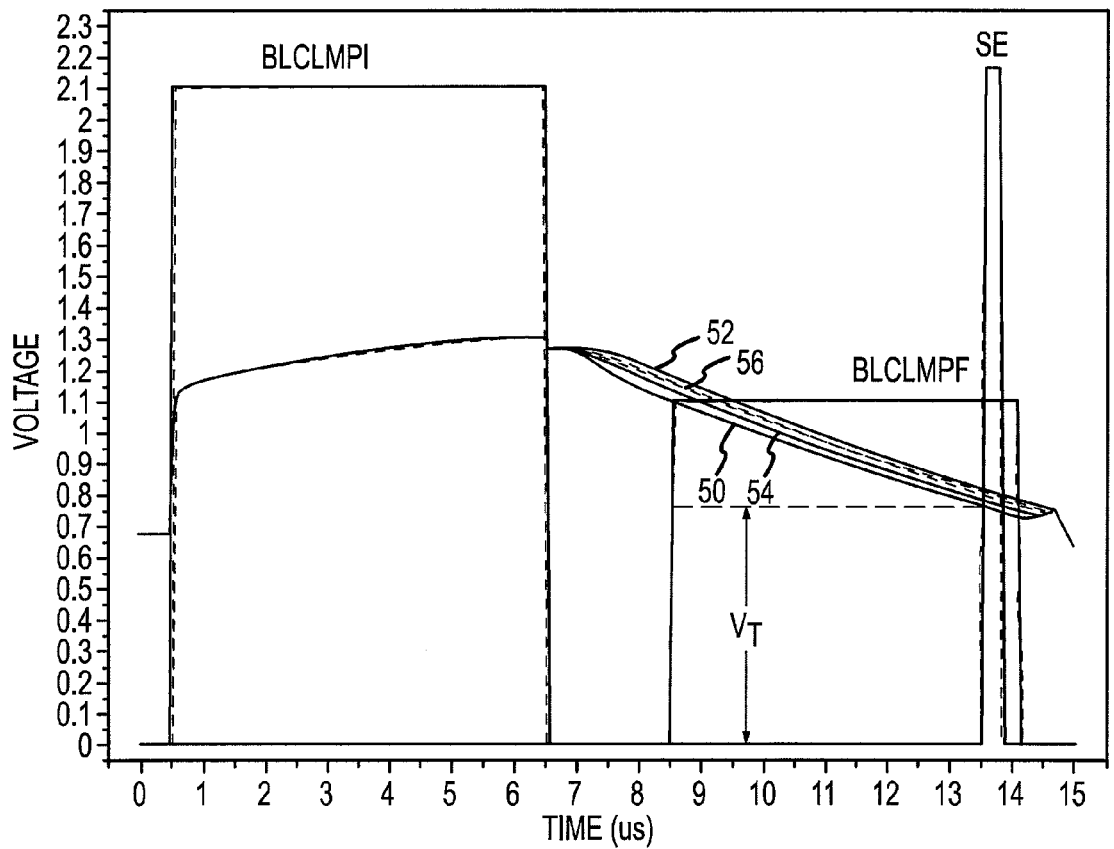
FIG. 2 is a prior art graph showing the manner in which the sensed voltages of bit lines in the array of FIG. 1 change at rates that vary as a function of the location of the block of memory cells that is active.
Figure 4:
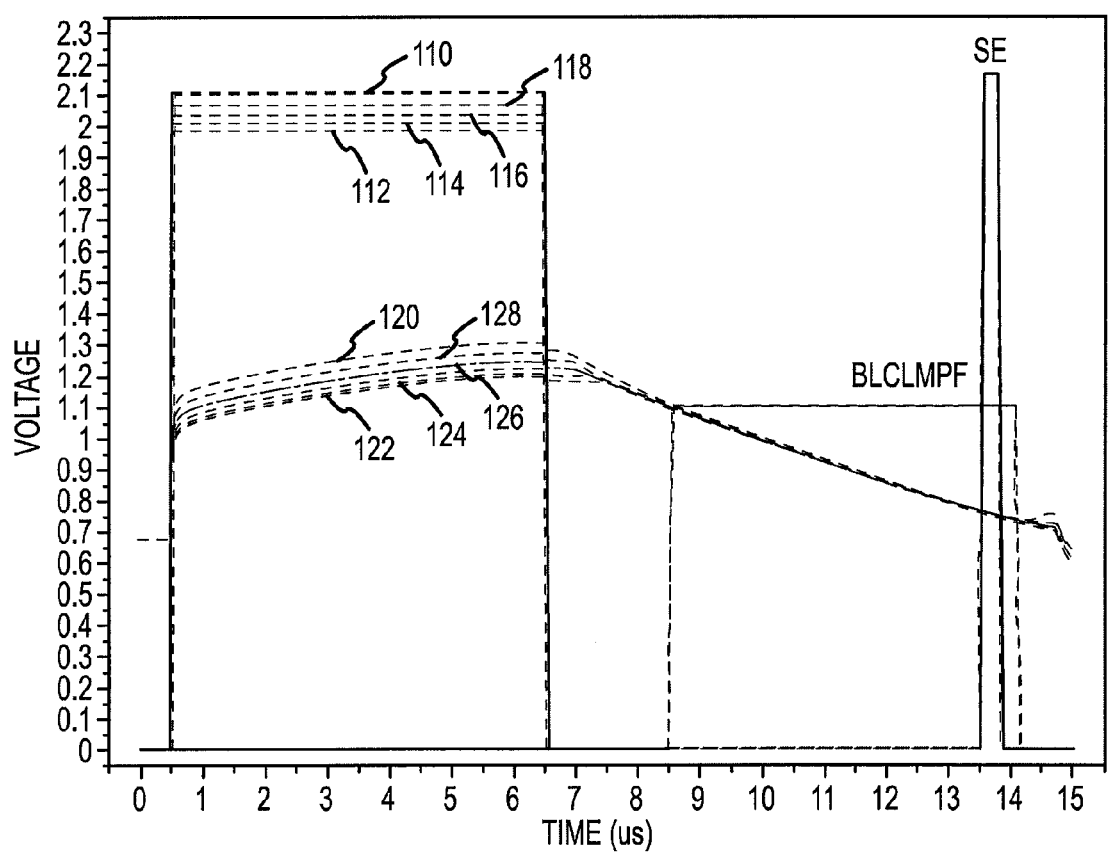
FIG. 4 is a graph simulating the manner in which the sensed voltages of bit lines in the array of FIG. 3 may change at rates that are substantially insensitive to the location of the block of memory cells that is active.

The effect of the adjustment in the bit line clamp voltage BLCLMP is apparent from the graph shown in FIG. 4. As in the prior art system discussed with reference to FIG. 2, the PRE signal transitions high and the BLCLMP signal transitions to an initial clamp voltage blclmpi at 0.5 μs. However, the magnitude of the initial clamp voltage blclmpi varies as a function of the location of the active memory cell block. For the block closest to the output transistors 44, the initial clamp voltage blclmpi has a relatively high voltage 110 since the output transistor 44 will detect the discharge of the bit line sooner if the active block is closer. For the block farthest from the output transistors 44, the initial clamp voltage blclmpi has a relatively low voltage 112 since the output transistor 44 will more slowly detect the discharge of the bit line. The initial clamp voltage blclmpi has intermediate magnitudes 114, 116, 118 for active memory blocks having intermediate locations. As a result, the bit lines 20 discharge from voltages 120, 122, 124, 126, 128 that are equal to the respective initial clamp voltages 110, 112, 114, 116, 118, respectively, less the threshold voltage of the clamp transistors 42.

As before, the BLCLMP signal transitions to zero at 6.5 μs, and a conductive string of memory cells 14 then begins discharging the bit line 20. The BLCLMP signal transitions to a final clamp voltage blclmpf at 8.5 μs, which is constant for all locations of the active memory cell block. However, in other embodiments, the magnitude of the final clamp voltage blclmpf varies as a function of the location of the active memory cell block instead of varying the magnitude of the initial clamp voltage blcmlpi as a function of the location of the active memory cell block. In still other embodiments, the magnitudes of both the initial clamp voltage blclmpi and the final clamp voltage blclmpf vary as a function of the location of the active memory cell block.

With further reference to FIG. 4, it can be seen from the simulated graph that the discharge of the bit line 20 at the gate of the output transistor 44 is constant and hence insensitive to the locations of the active memory cell block. This result is believed to be because the discharge began from voltages that are functions of the locations of the active memory cell block. Therefore, the bit line has the same voltage when the latch 48 is enabled by the SE signal starting at 13.5 μs regardless of the location of the active memory cell block. The bit line 20 is therefore correctly sampled as a logic "0" despite the variations in the distance between the output transistors 44 and the active memory cell block.

The ability to ensure that the bit line discharges to the same voltage when the voltage of the bit line is sensed despite variations in the location of the active memory cell block can also be obtained by varying the time at which the bit line is sensed as a function of the location of the active memory cell block. A bit line sensing system 150 according to another embodiment of the invention shown in FIG. 5 should make the operation of a memory device insensitive to variations in the location of the active memory cell block by varying the time at which the bit line is sensed. Again, the sensing system 150 is shown in the context of a NAND flash memory array 152, which is substantially identical to the NAND flash memory array 10 shown in FIG. 1 and therefore uses the same reference numerals.

Figure 5:
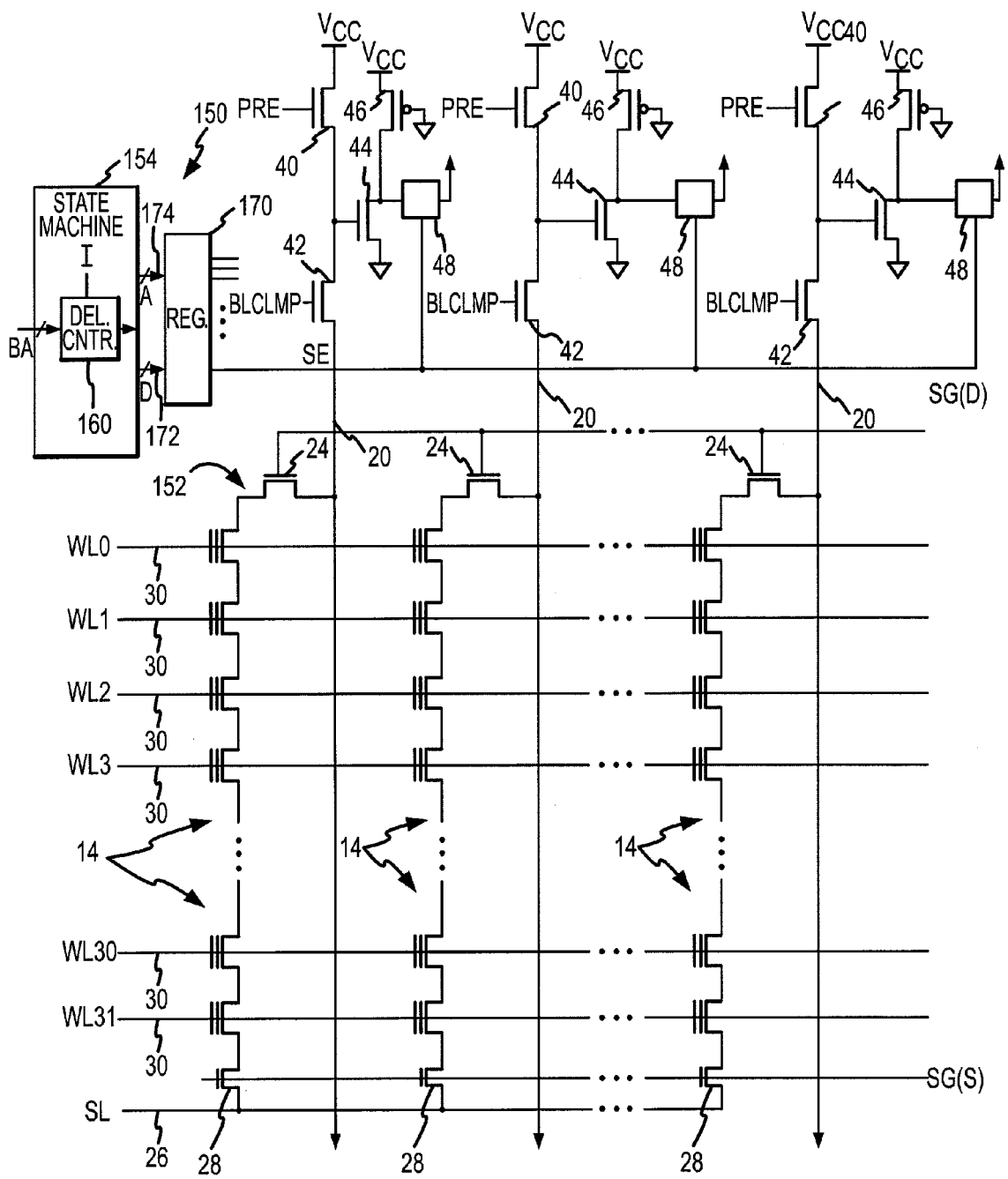
FIG. 5 is a block diagram of a bit line sensing system according to another embodiment of the invention.

The bit line sensing system 150 of FIG. 5 uses components that are normally in a memory device to perform other functions. Specifically, memory devices typically include a state machine 154, which is used to generate signals or timed sequences of signals to control the operation of the memory device. The state machine 154 may be a hard-wired device or it may be a software-based device. In either case, the bit line sensing system 150 uses a delay counter 160 that is typically used in memory devices. Unlike delay counters in the state machine 154 that normally provide a fixed delay, the delay counter 160 in the bit line sensing system 150 receives a block address BA corresponding to the block address of a row of memory cells being read. The BA may be larger for blocks that are farther from the output transistors 44. The BA is used to set the delay counter 160 to an initial count. The delay counter 160 also receives an initialization signal ("I") that may be triggered at the start of a read operation. The I signal causes the delay counter 160 to begin decrementing in a period manner.

When the delay counter 160 reaches the zero count, it causes the state machine 154 to store a data value transmitted through a data bus 172 in one of a set of registers 170 corresponding to an address transmitted through an address bus 174. The registers 170 are also typically used in a memory device to output respective control signals until a different value is written to the registers. The bit line sensing system 150 uses one of the registers 170 to output the sense enable SE signal to the latches 48. Thus, the time that the latches 48 sample the voltages on respective bit lines 20 varies as a function of the bit address. Specifically, the bit lines 20 are discharged for a shorter period before being sampled for a block address corresponding to a block that is closer to the output transistors 44. Conversely, the bit lines 20 are discharged for a longer period before being sampled for a block address corresponding to a block that is farther from the output transistors 44.

The bit line sensing system 150 may be used with conventional circuitry for applying the BLCLMP voltages to the clamp transistors 42. Alternatively, the bit line sensing system 150 may be used with the bit line sensing system 100 shown in FIG. 3 in which the magnitude of the BLCLMP voltage varies as a function of the block address BA.

Figure 6:
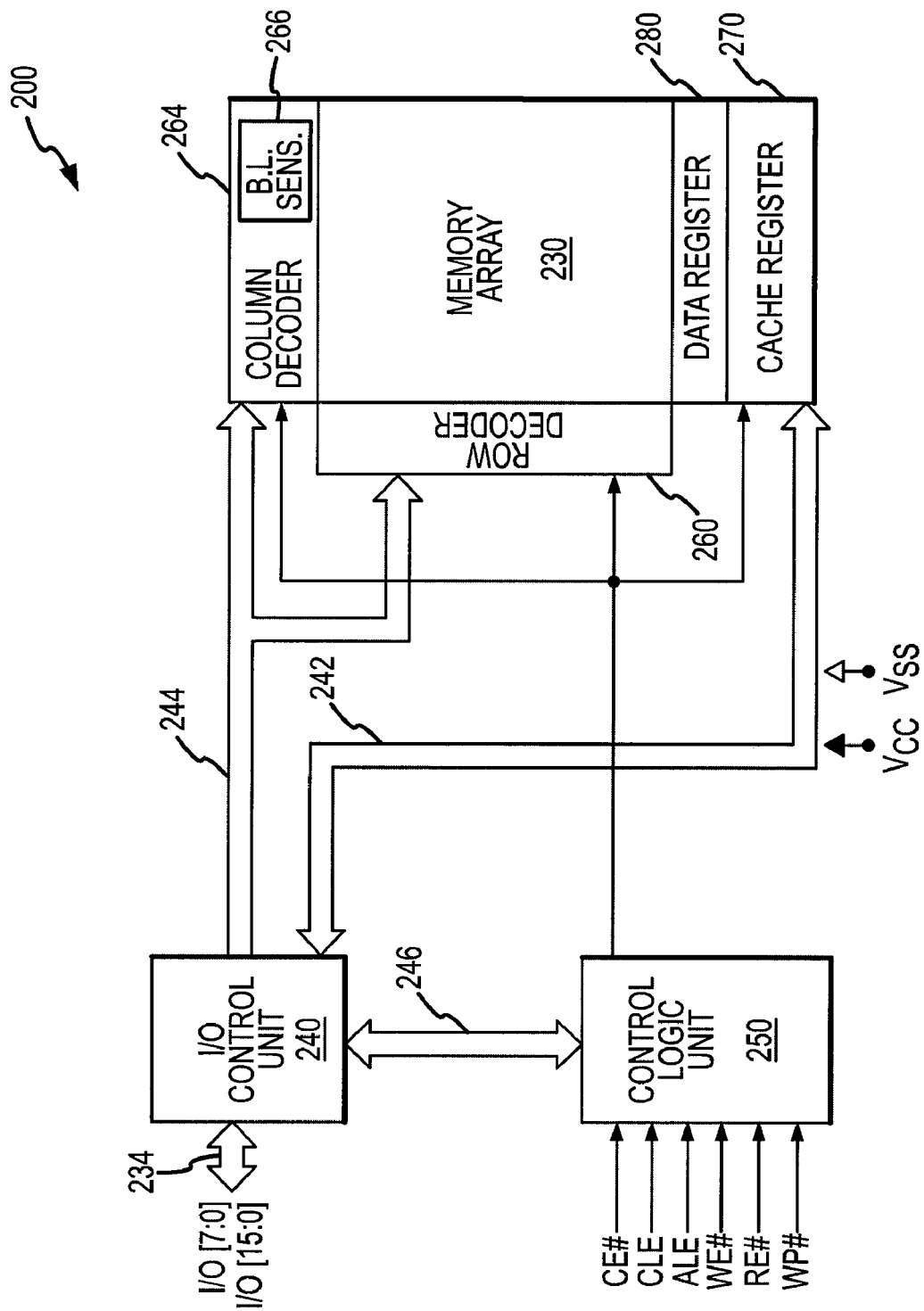
FIG. 6 is a memory device having a bit line sensing system according to an embodiment of the invention.

An embodiment of a flash memory device 200 that includes a bit line sensing system is shown in FIG. 6. The flash memory device 200 includes an array 230 of flash memory cells arranged in blocks of rows and columns. Most command signals, the address signals and the write data signals are applied to the flash memory device 200 as sets of sequential input/output ("I/O") signals transmitted through an I/O bus 234. Similarly, read data signals are output from the flash memory device 200 through the I/O bus 234. The I/O bus is connected to an I/O control unit 240 that routes the signals between the I/O bus 234 and an internal data bus 242, an internal address bus 244, and an internal command bus 246. The flash memory device 200 also includes a control logic unit 250 that receives a number of control signals either externally or through the command bus 246 to control the operation of the flash memory device 200. The address bus 244 applies row address signals to a row decoder 260 and column address signals to a column decoder 264. The column decoder 264 enables write data signals to be applied to bit lines for columns corresponding to the column address signals and allow read data signals to be coupled from bit lines for columns corresponding to the column address signals. More specifically, the column decoder 264 includes a bit line sensing system 266 that compensates for variations in the resistance of the bit lines as their lengths vary as a function of the distance between respective output transistors and the block of memory cells in the array 230 being read. The bit line sensing system 266 may be the bit line sensing system 150 of FIG. 5, or another embodiment of a bit line sensing system.

In response to the memory commands decoded by the control logic unit 250, the flash memory cells in the array 230 are erased, programmed, or read. The memory array 230 is programmed on a row-by-row or page-by-page basis. After the row address signals have been applied to the address bus 244, the I/O control unit 240 routes write data signals to a cache register 270. The write data signals are stored in the cache register 270 in successive sets each having a size corresponding to the width of the I/O bus 234. The cache register 270 sequentially stores the sets of write data signals for an entire row or page of flash memory cells in the array 230. All of the stored write data signals are then used to program a row or page of memory cells in the array 230 selected by the row address coupled through the address bus 246. In a similar manner, during a read operation, data signals from a row or page of memory cells selected by the row address coupled through the address bus 246 are stored in a data register 280. Sets of data signals corresponding in size to the width of the I/O bus 234 are then sequentially transferred through the I/O control unit 240 from the data register 280 through the I/O bus 234.

Figure 7:
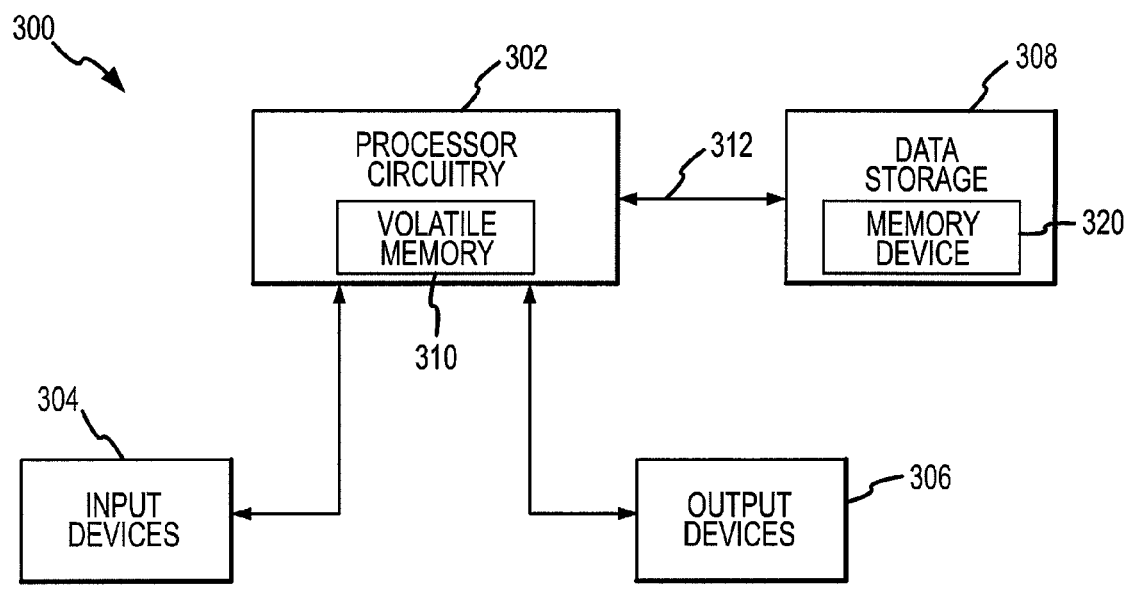
FIG. 7 is a block diagram of a processor-based system that includes a memory device according to an embodiment of the invention.

FIG. 7 is a block diagram of a processor-based system 300 including processor circuitry 302 having a volatile memory 310. The processor circuitry 302 is coupled through address, data, and control buses to the volatile memory 310 to provide for writing data to and reading data from the volatile memory 310. The processor circuitry 302 includes circuitry for performing various processing functions, such as executing specific software to perform specific calculations or tasks. The processor-based system 300 also includes one or more input devices 304 coupled to the processor circuitry 302 to allow an operator to interface with the processor-based system 300. Examples of input devices 304 include keypads, touch screens, and scroll wheels. The processor-based system 300 also includes one or more output devices 306 coupled to the processor circuitry 302 to provide output information to the operator. In one example, the output device 306 is a visual display providing visual information to the operator. Data storage 308 is also coupled to the processor circuitry 302 through a bus 312 to store data that is to be retained even when power is not supplied to the processor-based system 300 or to the data storage 308. The data storage 308 may include a non-volatile memory device 320, which may be the flash memory device 200 of FIG. 6 or anther embodiment of a non-volatile memory device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of reading a memory cell that is selectively coupled to a bit line, the method comprising:
determining a length of a bit line between the memory cell and an output transistor that is coupled to the memory cell;
generating at least one clamp voltage having a magnitude that is based at least in part on the determined length;
applying at least one voltage to the line that corresponds to the at least one clamp voltage; and
using the output transistor for sensing the state of the memory cell.

2. The method of claim 1 wherein the act of determining the length of the line between the memory cell and an output transistor that is coupled to the memory cell comprises:
receiving an address corresponding to a block in which the memory cell is located;
using the address to determine the location of the block; and
using the determined location to determine the length of the line between the memory cell and the output transistor.

3. The method of claim 1 wherein the act of generating at least one clamp voltage having a magnitude that is based at least in part on the determined length comprises:
obtaining a plurality of bits corresponding to the determined length; and
generating a voltage corresponding to the magnitude of the plurality of bits.

4. The method of claim 3 wherein the plurality of bits comprise block address bits corresponding to a block in which the memory cell is located.

5. The method of claim 1 wherein:
the act of generating at least one clamp voltage having a magnitude that is based at least in part on the determined length comprises generating a first clamp voltage and a second clamp voltage, at least one of the first and second clamp voltages having a magnitude that is based at least in part on the determined length;
the act of applying at least one voltage to the line that corresponds to the at least one clamp voltage comprises applying a precharge voltage to the line prior to coupling the memory cell to the output transistor, the precharge voltage corresponding to the first clamp voltage; and
applying a bias voltage to the line while coupling the memory cell to the output transistor, the bias voltage corresponding to the second clamp voltage.

6. The method of claim 1 wherein the act of generating at least one clamp voltage having a magnitude that is based at least in part on the determined length comprises adjusting the magnitude of the at least one clamp voltage based at least in part on variations in a process used to manufacture the memory cell.

7. A method of reading a memory cell that is selectively coupled to a bit line, the method comprising:
determining the distance between the memory cell and an output transistor that is coupled to the memory cell;
generating at least one voltage having a magnitude that is based at least in part on the determined distance, the at least one voltage being applied to the line that is coupled to the memory cell; and
using the output transistor sensing the state of the memory cell.

8. The method of claim 7 wherein the act of determining the distance between the memory cell and an output transistor that is coupled to the memory cell comprises:
receiving an address corresponding to a block in which the memory cell is located;
using the address to determine the location of the block; and
using the determined location to determine the distance between the memory cell and the output transistor.

9. The method of claim 7 wherein the act of generating at least one voltage having a magnitude that is based at least in part on the determined distance comprises:
obtaining a signal corresponding to the determined distance; and
generating a voltage corresponding to the magnitude of the signal.

10. A method comprising:
determining length of a line between a memory cell and an output transistor that is coupled to the line;
precharging the line;
coupling the memory cell to the output transistor through the line so that the line can be discharged by the memory cell;
using the output transistor to generate an output voltage corresponding to a voltage of the line;
sensing the output voltage after the memory cell has been coupled to the output transistor for a discharge period; and
adjusting the duration of the discharge period as a function of the determined length.

11. The method of claim 10 wherein the act of determining the length of the line between the memory cell and an output transistor that comprises:
receiving an address corresponding to a block in which the memory cell is located;

using the address to determine the location of the block; and using the determined location to determine the length of the line between the memory cell and the output transistor.

12. The method of claim 10 wherein the act of adjusting the duration of the discharge period as a function of the determined length comprises adjusting the duration of the discharge period based at least in part on the magnitude of the determined length.

13. A method of reading a memory cell that is selectively coupled to a bit line, the method comprising:

determining the length of the bit line between the memory cell and a transistor that is coupled to the bit line;

coupling the memory cell to the bit line;

using the transistor to generate an output voltage corresponding to a voltage of the bit line;

sampling the output voltage after the memory cell has been coupled to the bit line for a discharge period; and prior to or during the sampling of the output voltage, using the determined length to compensate for variations in the resistance of the bit line between the memory cell and the transistor resulting from variations in the length of the bit line between the memory cell and the transistor.

14. The method of claim 13 wherein the act of determining the length of the bit line between the memory cell and a transistor that is coupled to the bit line comprises:

receiving an address corresponding to a location of the memory cell; and using the address to determine the length of the bit line between the memory cell and the transistor.

15. The method of claim 14 wherein the address comprises a block address corresponding to a block in which the memory cell is located.

16. The method of claim 13 wherein:

the act of using the determined distance to compensate for variations in the resistance of the bit line between the memory cell and the transistor comprises generating at least one clamp voltage based at least in part on the determined length; and applying at least one voltage to the bit line having a magnitude that corresponds to at least one clamp voltage.

17. The method of claim 16 wherein:

the act of generating at least one clamp voltage based at least in part on the determined length comprises generating a first clamp voltage and a second clamp voltage, at least one of the first and second clamp voltages having a magnitude that is based at least in part on the determined length; and the act of applying at least one voltage to the line that corresponds to the at least one clamp voltage comprises:

applying a precharge voltage to the bit line prior to coupling the memory cell to the bit line, the precharge voltage corresponding to the first clamp voltage; and applying a bias voltage to the bit line while coupling the memory cell to the bit line, the bias voltage corresponding to the second clamp voltage.

18. The method of claim 13 wherein the act of using the determined distance to compensate for variations in the resistance of the bit line between the memory cell and the transistor comprises adjusting the duration of the discharge period as a function of the determined length.

19. The method of claim 18 wherein the act of adjusting the duration of the discharge period as a function of the determined length comprises adjusting the duration of the discharge period based at least in part on the magnitude of the determined length.

20. A method of reading a memory cell that is selectively coupled to a line, the method comprising:

determining the length of the line between the memory cell and a transistor that is coupled to the line;

coupling the memory cell to the line;

using the transistor to generate an output voltage corresponding to a voltage of the line;

sampling the output voltage after the memory cell has been coupled to the line for a discharge period; and prior to or during the sampling of the output voltage, using the determined length to compensate for variations in the resistance of the line between the memory cell and the transistor resulting from variations in the length of the line between the memory cell and the transistor.

21. The method of claim 20 wherein the act of determining the length of the line between the memory cell and a transistor that is coupled to the line comprises:

receiving an address corresponding to a location of the memory cell; and using the address to determine the length of the line between the memory cell and the transistor.

22. The method of claim 20 wherein the act of using the determined distance to compensate for variations in the resistance of the line between the memory cell and the transistor comprises:

generating at least one clamp voltage based at least in part on the determined length; and applying at least one voltage to the line that corresponds to the at least one clamp voltage.

23. The method of claim 22 wherein:

the act of generating at least one clamp voltage based at least in part on the determined length comprises generating a first clamp voltage and a second clamp voltage, at least one of the first and second clamp voltages having a magnitude that is based at least in part on the determined length;

the act of applying at least one voltage to the line that corresponds to the at least one clamp voltage comprises applying a precharge voltage to the line prior to coupling the memory cell to the line, the precharge voltage corresponding to the first clamp voltage; and applying a bias voltage to the line while coupling the memory cell to the line, the bias voltage corresponding to the second clamp voltage.

24. The method of claim 20 wherein the act of using the determined distance to compensate for variations in the resistance of the line between the memory cell and the transistor comprises adjusting the duration of the discharge period as a function of the determined length.

25. The method of claim 24 wherein the act of adjusting the duration of the discharge period as a function of the determined length comprises adjusting the duration of the discharge period based at least in part on the magnitude of the determined length.

26. A method of compensating for variations in the resistance of a line between a memory cell being read and an output transistor, the method comprising:

determining the length of the line between the memory cell and a transistor that is coupled to the line; and adjusting the manner in which the memory cell is read based at least in part on the determined length.

27. The method of claim 26 wherein the act of adjusting the manner in which the memory cell is read based at least in part on the determined length comprises, prior to reading the memory cell, precharging the bit line to a voltage having a magnitude that is a function of the determined length.

28. The method of claim 26 wherein the act of adjusting the manner in which the memory cell is read based at least in part on the determined length comprises, while reading the memory cell, adjusting the duration of the discharge period based at least in part on the determined length.

29. A system for compensating for variations in the resistance of a line between a memory cell being read through the line and an output transistor coupled to the line, the variations in the resistance resulting from variations in the location of the memory cell being read, the system comprising:
   a voltage generating circuit operable to generate a clamp voltage having a magnitude that is determined at least in part by a received address corresponding to the location of the memory cell; and
   a clamp circuit coupled to receive the clamp voltage from the voltage generating circuit and being operable to apply a voltage to a line that may be coupled to the memory cell, the voltage having a magnitude that is determined at least in part by the magnitude of the clamp voltage.

30. The system of claim 29 wherein the voltage generating circuit comprises a digital-to-analog converter.

31. A system for compensating for variations in the resistance of a line between a memory cell being read through the line and an output transistor coupled to the line, the variations in the resistance resulting from variations in the location of the memory cell being read, the system comprising:
   a sampling circuit coupled to the output transistor for sampling a voltage of the line responsive to a sample control signal; and
   a timing circuit operable to generate the sample signal at a time that is at least in part determined by a received address corresponding to the location of the memory cell.

32. The system of claim 31 wherein the timing circuit comprises a counter that is operable to count from a value corresponding to the received address, the counter being operable to generate the sample control signal when the counter has counted to a predetermined value.

33. A memory device, comprising:
   an array of non-volatile memory cells coupled to the address decoder, the array including a plurality of blocks of memory cells arranged in columns and a plurality of lines in each block that may be coupled to the memory cells in respective columns of the block, the lines in each block being coupled to respective output transistors;
   an address decoder operable to receive and decode an address corresponding to the location of at least one memory cell in the array;
   an I/O control unit operable to couple a set of terminals to either the address decoder or the array of non-volatile memory cells;
   a control logic unit operable to receive a memory command and to control the operation of the address decoder, the array of non-volatile memory cells, and the I/O control unit responsive to the memory command; and
   a system for compensating for variations in the resistance of the lines between memory cells being read through the respective lines and the respective output transistors, the system comprising:
   a voltage generating circuit operable to generate a clamp voltage having a magnitude that is at least in part determined by a portion of the decoded address that corresponds to the block in which the memory cell is located; and
   a clamp circuit coupled to receive the clamp voltage from the voltage generating circuit and being operable to apply a voltage to each of the lines that may be coupled to a respective one of the memory cells, the voltage having a magnitude that is determined at least in part by the magnitude of the clamp voltage.

34. The system of claim 33 wherein the voltage generating circuit comprises a digital-to-analog converter.

35. A memory device, comprising:
   an array of non-volatile memory cells including a plurality of blocks of memory cells arranged in columns and a plurality of bit lines in each block that may be coupled to the memory cells in respective columns of the block, the bit lines being coupled to respective output transistors;
   an address decoder operable to receive and decode an address corresponding to a location in the array of at least one memory cell;
   an I/O control unit operable to couple a set of terminals to either the address decoder or the array of non-volatile memory cells;
   a respective sampling circuit coupled to each of the output transistors for sampling a voltage of the respective bit line responsive to a sample control signal;
   a timing circuit operable to generate the sample control signal at a time that is determined at least in part by a portion of the decoded address that corresponds to the block in which the memory cell is located; and
   a control logic unit coupled to the array, the address decoder, the I/O control unit, the control logic unit being operable to receive a memory command and to control the operation of the array, the address decoder, and the I/O control unit responsive to the memory command.

36. The non-volatile memory device of claim 35 wherein the timing circuit comprises a counter that is operable to count from a value corresponding to the received address, the counter being operable to generate the sample control signal when the counter has counted to a predetermined value.

37. A system, comprising:
   a processor; and
   a non-volatile memory device coupled to the processor, the non-volatile memory device comprising:
   an array of non-volatile memory cells including a plurality of blocks of memory cells arranged in columns and a plurality of bit lines in each block that may be coupled to the memory cells in respective columns of the block, the bit lines being coupled to respective output transistors;
   an address decoder operable to decode an address received from the processor, the received address corresponding to a location in the array of at least one memory cell;
   an I/O control unit operable to couple a set of terminals to either the address decoder or the array of non-volatile memory cells;
   a respective sampling circuit coupled to each of the output transistors for sampling a voltage of the respective bit line responsive to a sample control signal;
   a timing circuit operable to generate the sample control signal at a time that is determined at least in part by a portion of the decoded address that corresponds to the block in which the memory cell is located; and
   a control logic unit coupled to the array, the address decoder, the I/O control unit, the control logic unit being operable to receive a memory command from the processor and to control the operation of the array, the address decoder, and the I/O control unit responsive to the memory command.

38. A system, comprising:
   a processor; and
   a non-volatile memory device coupled to the processor, the non-volatile memory device comprising:

an array of non-volatile memory cells coupled to the address decoder, the array including a plurality of blocks of memory cells arranged in columns and a plurality of bit lines in each block that may be coupled to the memory cells in respective columns of the block, the bit lines in each block being coupled to respective output transistors;

an address decoder operable to decode an address received from the processor, the received address corresponding to the location in the array of at least one memory cell;

an I/O control unit operable to couple a set of terminals to either the address decoder or the array of non-volatile memory cells;

a control logic unit a control logic unit coupled to the array, the address decoder, the I/O control unit, the control logic unit being operable to receive a memory command from the processor and to control the operation of the array, the address decoder, and the I/O control unit responsive to the memory command;

a voltage generating circuit operable to generate a clamp voltage having a magnitude that is determined at least in part by a portion of the decoded address that corresponds to the block in which the memory cell is located; and a clamp circuit coupled to receive the clamp voltage from the voltage generating circuit and being operable to apply a voltage to each of the bit lines that may be coupled to a respective one of the memory cells, the voltage having a magnitude that is determined at least in part by the magnitude of the clamp voltage.

* * * * *

UNITED STATES PATENT AND TRADEMARK OFFICE
CERTIFICATE OF CORRECTION

PATENT NO. : 7,296,035 B2
APPLICATION NO. : 11/824082
DATED : September 29, 2009
INVENTOR(S) : Daniel Doyle et al.

Page 1 of 1

It is certified that error appears in the above-identified patent and that said Letters Patent is hereby corrected as shown below:

In column 13, line 14, in Claim 38, after "a control logic unit" delete "a control logic unit".

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,596,035 B2 Page 1 of 1
APPLICATION NO. : 11/824082
DATED : September 29, 2009
INVENTOR(S) : Daniel Doyle et al.

It is certified that error appears in the above-identified patent and that said Letters Patent is hereby corrected as shown below:

This supersede replaces the Certificate of Correction issued on November 24, 2009 that contained a typographical error in the patent number. The patent number was printed incorrectly as 7,296,035. The correction in the November 24, 2009 Certificate of Correction belong to Patent No. 7,596,035.

In column 13, line 14, in Claim 38, after "a control logic unit" delete "a control logic unit".

This certificate supersedes the Certificate of Correction issued November 24, 2009.

Signed and Sealed this

Twenty-sixth Day of January, 2010

David J. Kappos
*Director of the United States Patent and Trademark Office*